US012593488B2

(12) United States Patent
Fiorenza et al.

(10) Patent No.: US 12,593,488 B2
(45) Date of Patent: Mar. 31, 2026

(54) COMPOUND SEMICONDUCTOR DEVICES COMBINED IN A FACE-TO-FACE ARRANGEMENT

(71) Applicant: Analog Devices, Inc., Wilmington, MA (US)

(72) Inventors: James G. Fiorenza, Carlisle, MA (US); Daniel Piedra, Somerville, MA (US)

(73) Assignee: Analog Devices, Inc., Wilmington, MA (US)

( * ) Notice: Subject to any disclaimer, the term of this patent is extended or adjusted under 35 U.S.C. 154(b) by 417 days.

(21) Appl. No.: 18/245,451

(22) PCT Filed: Sep. 14, 2021

(86) PCT No.: PCT/US2021/050292
§ 371 (c)(1),
(2) Date: Mar. 15, 2023

(87) PCT Pub. No.: WO2022/060741
PCT Pub. Date: Mar. 24, 2022

(65) Prior Publication Data
US 2023/0299156 A1      Sep. 21, 2023

Related U.S. Application Data

(60) Provisional application No. 63/078,820, filed on Sep. 15, 2020.

(51) Int. Cl.
H10D 64/23 (2025.01)
H01L 23/367 (2006.01)
(Continued)

(52) U.S. Cl.
CPC ....... H10D 64/251 (2025.01); H01L 23/3672 (2013.01); H01L 23/5226 (2013.01);
(Continued)

(58) Field of Classification Search
CPC .............. H10D 64/251; H10D 64/511; H10D 62/8503; H10D 62/235; H10D 30/015;
(Continued)

(56) References Cited

U.S. PATENT DOCUMENTS 7,045,440 B2      5/2006  Huff et al.
7,585,706 B2      9/2009  Nishii et al.
(Continued)

FOREIGN PATENT DOCUMENTS

CN      106549048  A      3/2017
CN      110148561  A      8/2019
(Continued)

OTHER PUBLICATIONS

"International Application Serial No. PCT/US2021/050292, International Search Report mailed Dec. 28, 2021", 3 pgs.
(Continued)

*Primary Examiner* — Tu-Tu V Ho
(74) *Attorney, Agent, or Firm* — Schwegman Lundberg & Woessner, P.A.

(57) ABSTRACT

In one or more implementations, a semiconductor device can include a first compound semiconductor device coupled to a second compound semiconductor device coupled in a face-to-face arrangement. The first compound semiconductor device can be coupled to the second compound semiconductor device such that a cavity is formed that includes a first gate electrical contact of the first compound semiconductor device and a second gate electrical contact of the second compound semiconductor device. A gap can be present between the first gate electrical contact and the second gate electrical contact.

20 Claims, 3 Drawing Sheets

(51) Int. Cl.

| | |
|---|---|
| *H01L 23/522* | (2006.01) |
| *H01L 23/528* | (2006.01) |
| *H01L 23/66* | (2006.01) |
| *H10D 30/01* | (2025.01) |
| *H10D 30/47* | (2025.01) |
| *H10D 62/17* | (2025.01) |
| *H10D 62/85* | (2025.01) |
| *H10D 64/27* | (2025.01) |

(52) U.S. Cl.
CPC .......... *H01L 23/5283* (2013.01); *H01L 23/66* (2013.01); *H10D 30/015* (2025.01); *H10D 30/475* (2025.01); *H10D 62/235* (2025.01); *H10D 62/8503* (2025.01); *H10D 64/511* (2025.01)

(58) Field of Classification Search
CPC .............. H10D 30/475; H01L 23/3672; H01L 23/5226; H01L 23/5283; H01L 23/66
USPC ........................................................ 257/183
See application file for complete search history.

(56) References Cited

U.S. PATENT DOCUMENTS

| | | | |
|---|---|---|---|
| 8,030,665 | B2 | 10/2011 | Nagahama et al. |
| 8,940,104 | B2 | 1/2015 | Zhong et al. |
| 9,053,964 | B2 | 6/2015 | Jeon et al. |
| 9,413,308 | B2 | 8/2016 | Van Der Zanden et al. |
| 9,748,205 | B2 | 8/2017 | Lu et al. |
| 9,824,949 | B2 | 11/2017 | Mcknight-macneil et al. |
| 10,002,928 | B1 | 6/2018 | Raring et al. |
| 10,014,292 | B2 | 7/2018 | Or-Bach et al. |
| 10,032,750 | B2 | 7/2018 | Deligianni et al. |
| 2004/0259325 | A1 | 12/2004 | Gan |
| 2010/0230722 | A1 | 9/2010 | Chang et al. |
| 2014/0091366 | A1 | 4/2014 | Jeon et al. |
| 2015/0125995 | A1 | 5/2015 | Lee et al. |
| 2017/0301772 | A1 | 10/2017 | Radway et al. |
| 2019/0081039 | A1 | 3/2019 | Siemieniec et al. |
| 2023/0302584 | A1* | 9/2023 | Uno .................. B23K 35/0261 |

FOREIGN PATENT DOCUMENTS

| | | |
|---|---|---|
| KR | 20150006845 | 1/2015 |
| KR | 101673965 B1 | 11/2016 |
| WO | WO-2022060741 A1 | 3/2022 |

OTHER PUBLICATIONS

"International Application Serial No. PCT/US2021/050292, Written Opinion mailed Dec. 28, 2021", 3 pgs.

Sun, Ruize, et al., "GaN Power Integration for High Frequency and High Efficiency Power Applications: A Review", IEEE Access, 8, (2020), 15529-15542.

"International Application Serial No. PCT/US2021/050292, International Preliminary Report on Patentability mailed Mar. 30, 2023", 5 pgs.

"Chinese Application Serial No. 202180062793.8, Notification to Make Rectification mailed Apr. 19, 2023", 2 pgs.

"Chinese Application Serial No. 202180062793.8, Voluntary Amendment filed Oct. 4, 2023", w/ English claims, 12 pgs.

"European Application Serial No. 21870071.4, Partial Supplementary European Search Report mailed Sep. 11, 2024", 17 pgs.

"European Application Serial No. 21870071.4, Extended European Search Report mailed Dec. 2, 2024", 16 pgs.

"Korean Application Serial No. 10-2023-7008585, Notice of Preliminary Rejection mailed Apr. 9, 2025", w/ English Translation, 17 pgs.

"Korean Application Serial No. 10-2023-7008585, Response filed Jun. 5, 2025 to Notice of Preliminary Rejection mailed Apr. 9, 2025", w/ English Claims, 21 pgs.

"European Application Serial No. 21870071.4, Response filed Jun. 17, 2025 to Extended European Search Report mailed Dec. 2, 2024", w/ English Claims, 15 pgs.

* cited by examiner

200

202

PRODUCE A FIRST COMPOUND SEMICONDUCTOR DEVICE

204

PRODUCE A SECOND COMPOUND SEMICONDUCTOR DEVICE

206

COUPLE THE FIRST COMPOUND SEMICONDUCTOR DEVICE TO THE SECOND COMPOUND SEMICONDUCTOR DEVICE IN A FACE-TO-FACE ARRANGEMENT

COMPOUND SEMICONDUCTOR DEVICES COMBINED IN A FACE-TO-FACE ARRANGEMENT

CLAIM OF PRIORITY

This application claims priority to U.S. Provisional Patent Application Ser. No. 63/078,820, filed Sep. 15, 2020, which is hereby incorporated by reference herein in its entirety.

FIELD OF THE DISCLOSURE

This document pertains generally, but not by way of limitation, to apparatuses and methods related to increasing power density of compound semiconductor devices.

BACKGROUND

Electronic devices that are constructed from compound semiconductor materials can operate at higher frequencies and with higher power levels than similar silicon-based devices. The advantages of these compound semiconductor devices are derived, at least in part, from the higher critical breakdown field of compound semiconductors, such as gallium nitride (GaN), as compared to silicon (Si). For example, gallium nitride has a critical breakdown field of 3 MV/cm, while Si has a critical breakdown field of 0.3 MV/cm. The performance of compound semiconductor devices may be improved by increasing the power density of the compound semiconductor devices. The power density can indicate an amount of power emitted by a device in relation to a measure of a dimension of the gate of the device, such as a width of the gate.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various implementations discussed in the present document.

DETAILED DESCRIPTION

Figure 1:
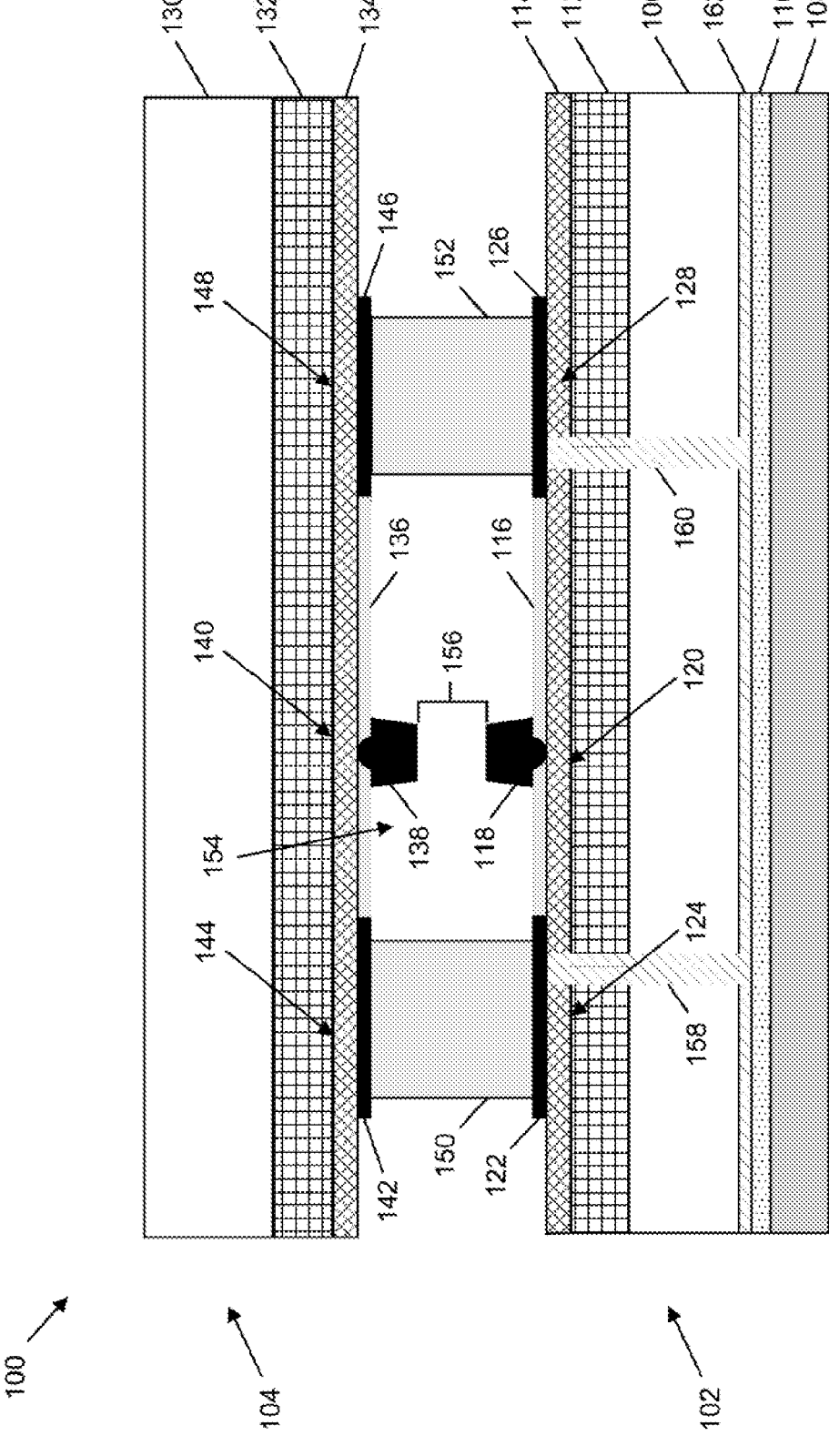
FIG. 1 is a diagram depicting a cross-section of at least a portion of an example semiconductor device including a first compound semiconductor device that is coupled to a second compound semiconductor device in a face-to-face arrangement.

Integrated circuit components can be formed using one or more compound semiconductors. The one or more compound semiconductors can include a combination of a Group 13 element and a Group 15 element. The integrated circuit components described herein can also comprise one or more compound semiconductors that have one or more combinations of elements that are different from a Group 13 element and a Group 15 element combination. To illustrate, integrated circuit components described herein can comprise zinc oxide (ZnO).

The integrated circuit components described herein can include transistors, such field effect transistors. In particular examples, high electron mobility transistors (HEMTs) can be produced. HEMTs can include a first layer comprising a first compound semiconductor coupled with one or more second layers comprising one or more second compound semiconductors. The one or more second compound semiconductors can have a different bandgap and polarization field from the first compound semiconductor. The first layer and the one or more second layers can together form one or more heterostructures.

The first compound semiconductor that comprises the first layer can include a combination of one or more group 13 elements and one or more group 15 elements. For example, the first compound semiconductor can include gallium nitride (GaN). In addition, the first compound semiconductor can include aluminum nitride (AlN). Further, the first compound semiconductor can include gallium arsenide (GaAs). The first compound semiconductor can also include indium phosphide (InP).

A second compound semiconductor that comprises a second layer coupled to the first layer can include a combination of one or more group 13 elements and one or more group 15 elements. To illustrate, the second compound semiconductor can include aluminum gallium nitride (AlGaN). Additionally, the second compound semiconductor can include aluminum indium gallium nitride (AlInGaN). Further, the second compound semiconductor can include indium aluminum nitride (InAlN).

An example of a heterostructure that includes a first compound semiconductor and one or more second compound semiconductors can include a GaN layer coupled with an AlGaN layer. Another example of a heterostructure that includes a first compound semiconductor and one or more second compound semiconductors can include an AlN layer coupled with an InAlN layer. Additional examples of heterostructures can include AlN/GaN/AlN and InAlN/GaN. Further, various other combinations of elements from Group 13 (e.g., boron (B), aluminum (Al), gallium (Ga), indium (In) and thallium (Tl)) with elements from group 15 (e.g., nitrogen (N), phosphorus (P), arsenic (As), antimony (Sb), and bismuth (Bi)) can form heterostructures that can be used to form compound semiconductor devices.

The coupling of a first layer comprising a first compound semiconductor with one or more second layers comprised of one or more second compound semiconductors can create an interface between the layers that has a relatively high electron mobility. The interface can be a two-dimensional electron gas (2DEG). When a voltage is applied to a gate electrical contact of a compound semiconductor device, an electric field can be produced that can cause the movement of electrons within a channel region that includes the 2DEG. In this way, current between a source region and a drain region of a compound semiconductor device can be controlled.

One or more examples of a compound semiconductor device can include a GaN-based semiconductor device that includes a layer comprised of GaN. GaN-based semiconductor devices can be used in power circuitry, such as high-power density integrated circuits and power conversion integrated circuits. GaN-based transistors can also be used in integrated circuits that operate at relatively high frequencies. In various examples. GaN-based transistors can be implemented in monolithic microwave integrated circuits (MMICs) that operate at frequencies within the microwave range of electromagnetic radiation, such as at frequencies from about 300 megahertz (MHz) to about 300 gigahertz (GHz). In one or more illustrative examples, a high-power density can be a power density of at least 5 watts per millimeter (W/mm) and a high frequency can be a frequency of at least 5 gigahertz (GHz). Typically, GaN-based radio frequency transistors can have a power density of about 8 watts ((W) per millimeter (mm) gate width at frequencies of about 1 GHz GaN-based radio frequency transistors operating at frequencies of about 30 GHz can have a power density of about 4 W/mm gate width.

Implementations described herein can increase the power density of GaN-based transistors to at least 8 W/of mm gate width at frequencies of at least about 30 GHz. In one or more illustrative examples, one or more implementations of GaN-based transistors can have a power density of at least about 8 W/mm gate width to about 12 W/mm gate width at frequencies from about 25 GHz to about 35 GHz. In one or more examples, devices described herein can have an increased power density by coupling a first compound semiconductor device to a second compound semiconductor device in a face-to-face arrangement.

In various examples, a first compound semiconductor device can include one or more first gate electrical contacts, one or more first source electrical contacts, and one or more drain electrical contacts. In addition, a second compound semiconductor device can include one or more second gate electrical contacts, and one or more drain electrical contacts. The first compound semiconductor device can be coupled to the second compound semiconductor device using a conductive bonding material. For example, the one or more first source electrical contacts of the first compound semiconductor device can be coupled to the one or more second source electrical contacts of the second compound semiconductor device using the conductive bonding material. In addition, the one or more first drain electrical contacts of the first compound semiconductor device can be coupled to the one or more second drain electrical contacts of the second compound semiconductor device by the conductive bonding material. In one or more examples, a bonding material may not be applied to the one or more first gate electrical contacts of the first compound semiconductor device and the one or more second gate electrical contacts of the second compound semiconductor device. As a result, a gap can be present between at least a portion of the one or more first gate electrical contacts of the first compound semiconductor device and the one or more second gate electrical contacts of the second compound semiconductor device.

The first compound semiconductor device can be coupled to the second compound semiconductor device such that one or more cavities are produced. Individual cavities can be produced such that a first gate electrical contact of the first compound semiconductor device and a second gate electrical contact of the second compound semiconductor device are disposed within an individual cavity. In various examples, the individual cavities can be hermetically sealed containers for the gate electrical contacts of the first compound semiconductor device and the second compound semiconductor device. In one or examples, the cavity can include an inert gas, such as nitrogen or argon. Additionally, the cavity can be free from additional materials, such as a dielectric material.

The implementations described herein that include a first compound semiconductor device and a second compound semiconductor device coupled in a face-to-face arrangement can increase the power density with respect to existing devices by increasing the dimensions of the gate electrical contacts. That is, rather than having a single set of one or more gate electrical contacts that can carry current, the devices described herein can have a first set of one or more gate electrical contacts that have typical dimensions of gate electrical contacts added to a second set of one or more gate electrical contacts. Thus, the second set of gate electrical contacts provides increased overall dimensions for the gate electrical contacts, which, in turn, increases the power density of the devices described herein. In addition, by disposing the gate electrical contacts in a hermetically sealed container that is free of dielectric materials, implementations described herein can minimize parasitic loss by the gate electrical contacts that can be present when the gate electrical contacts are encased in one or more dielectric materials. Disposing the gate electrical contacts in a hermetically sealed container can also minimize moisture and other contaminants that can contact the gate electrical contacts. As a result, reliability of devices that include the gate electrical contacts disposed in a hermetically sealed cavity can have increased reliability in relation to devices with gate electrical contacts that are protected by existing packaging techniques.

Further, the implementations described herein provide double-sided cooling for the increased current flow through the device that results in the increased power density. For example, each the first compound semiconductor device and the second compound semiconductor device can each include a substrate, such as a silicon carbide (SiC) substrate, by which cooling can take place. Thus, the capacity to dissipate the increased heat generated by the devices described herein can be increased due to the increased volume of heat dissipating material included in the devices. In various examples, the amount of packaging utilized with respect to the device described herein can also be minimized. To illustrate, the bonding of the source electrical contacts and the drain electrical contacts of the compound semiconductor devices described herein in addition to the disposition of the gate electrical contacts within a hermetically sealed cavity cause the electrical components of the devices to be protected. Accordingly, packaging that would typically be used to protect these electrical contacts is unnecessary and may reduce resources and expenses utilized to produce implementations of the devices described herein.

FIG. 1 is a diagram depicting a cross-section of at least a portion of an example semiconductor device 100 including a first compound semiconductor device 102 that is coupled to a second compound semiconductor device 104 in a face-to-face arrangement. The first compound semiconductor device 102 can include a first substrate 106. In one or more illustrative examples, the first substrate 106 can be a SiC-containing substrate. The first substrate 106 can also include an Si-containing substrate. Further, the first substrate 106 can include a sapphire substrate. In one or more examples, the first substrate 106 can include an aluminum nitride-(AlN) containing substrate. A thickness of the first substrate 106 can be from about 75 micrometers to about 400 micrometers, from about 100 micrometers to about 200 micrometers, from about 200 micrometers to about 300 micrometers, from about 75 micrometers to about 150 micrometers, or from about 150 micrometers to about 250 micrometers. The first substrate 106 can be coupled to a carrier substrate 108 using a substrate bonding material layer 110. The substrate bonding material layer 110 can include a polymeric bonding adhesive. Additionally, the substrate bonding material layer 110 can include one or more dielectric materials. In various examples, the first substrate 106 can be coupled to the carrier substrate 108 for support due to the thickness of the first substrate 106 being no greater than about 400 micrometers.

The first compound semiconductor device 102 can include a first compound semiconductor layer 112. The first compound semiconductor layer 112 can include one or more compound semiconductors. The one or more compound semiconductors can include at least one element from Group 13 of the periodic table of elements and at least one element from Group 15 of the periodic table of elements. For example, the first compound semiconductor layer 112 can include GaN. In addition, the first compound semiconductor layer 112 can include GaAs. Further, the first compound semiconductor layer 112 can include AlN. The first compound semiconductor layer 112 can also include InP. The first compound semiconductor layer 112 can have a thickness from about 250 nm to about 1500 nm, from about 400 nm to about 1200 nm, from about 500 nm to about 1000 nm, from about 100 nm to about 500 nm, from about 100 nm to about 300 nm, or from about 30 nm to about 250 nm.

In addition, the first compound semiconductor device 102 can include a second compound semiconductor layer 114 that is disposed on the first compound semiconductor layer 112. The second compound semiconductor layer 114 can include one or more compound semiconductors. The one or more compound semiconductors can include at least one element from Group 13 of the periodic table of elements and at least one element from Group 15 of the periodic table of elements. For example, the second compound semiconductor layer 114 can be an AlGaN barrier layer, in various implementations. The second compound semiconductor layer 114 can also be an AlInGaN barrier layer. A 2-dimensional electron gas (2DEG) layer can be formed at the interface of the first compound semiconductor layer 112 and the second compound semiconductor layer 114 that enables the flow of electrons through the 2DEG. The first compound semiconductor layer 112 and the second compound semiconductor layer 114 can comprise at least a portion of a semiconductor layer that can be used to form one or more semiconductor devices, such as transistors. In one or more illustrative examples, the 2DEG layer can be formed at an interface of a first compound semiconductor layer 112 that is comprised of GaN and a second compound semiconductor layer 114 comprised of AlGaN.

Although not shown in the illustrative example of FIG. 1, the first compound semiconductor device 102 can include a nucleation layer that is disposed between the first substrate 106 and the first compound semiconductor layer 112. The nucleation layer can have a thickness from about 10 nanometers to about 200 nanometers, from about 20 nanometers to about 100 nanometers, or from about 20 nanometers to about 80 nanometers. In addition, the nucleation layer can include an AlN-containing material. The nucleation layer can be used to form the first compound semiconductor layer 112.

A first dielectric layer 116 can be disposed on at least a portion of the second compound semiconductor layer 114. The first dielectric layer 116 can include a SiN-containing material. Additionally, a first gate electrical contact 118 can be disposed over a first gate region 120. The first gate electrical contact 118 can include one or more suitable metallic materials. For example, the first gate electrical contact 118 can include a gold-containing material. In one or more illustrative examples, the first gate electrical contact 118 can also include a nickel (Ni)/gold (Au) material. In one or more additional examples, the first gate electrical contact 118 can include a titanium-containing material.

Further, a first source electrical contact 122 can be disposed over a first source region 124 and a first drain electrical contact 126 can be disposed over a first drain region 128. The first source electrical contact 122 and the first drain electrical contact 126 can include one or more suitable metallic materials. To illustrate, the first source electrical contact 122 and the first drain electrical contact 126 can include a gold-containing material. In one or more additional illustrative examples, the first source electrical contact 122 and the first drain electrical contact 126 can include a Ti/Au metallic material.

The second compound semiconductor device 104 can include a second substrate 130. In one or more illustrative examples, the second substrate 130 can be a SiC-containing substrate. The second substrate 130 can also include an Si-containing substrate. Further, the second substrate 130 can include a sapphire substrate. In one or more examples, the second substrate 130 can include an aluminum nitride-(AlN) containing substrate. A thickness of the second substrate 130 can be from about 75 micrometers to about 400 micrometers, from about 100 micrometers to about 200 micrometers, from about 200 micrometers to about 300 micrometers, from about 75 micrometers to about 150 micrometers, or from about 150 micrometers to about 250 micrometers. The second substrate 130 can include the same or similar materials as the first substrate 106. In various examples, the second substrate 130 can include one or more different materials with respect to the materials of the first substrate 106.

The second compound semiconductor device 104 can also include a first additional compound semiconductor layer 132 that can include one or more compound semiconductors having at least one element from Group 13 of the periodic table of elements and at least one element from Group 15 of the periodic table of elements. For example, the first additional compound semiconductor layer 132 can include GaN. In addition, the first additional compound semiconductor layer 132 can include GaAs. Further, the first additional compound semiconductor layer 132 can include AlN. The first additional compound semiconductor layer 132 can also include InP. The first additional compound semiconductor layer 132 can have a thickness from about 250 nm to about 1500 nm, from about 400 nm to about 1200 nm, from about 500 nm to about 1000 nm, from about 100 nm to about 500 nm, from about 100 nm to about 300 nm, or from about 30 nm to about 250 nm.

In addition, the second compound semiconductor device 104 can include a second additional compound semiconductor layer 134 that is disposed on the first additional compound semiconductor layer 132. The second additional compound semiconductor layer 134 can include one or more compound semiconductors, having at least one element from Group 13 of the periodic table of elements and at least one element from Group 15 of the periodic table of elements. For example, the second additional compound semiconductor layer 134 can be an AlGaN barrier layer, in various implementations. The second additional compound semiconductor layer 134 can also be an AlInGaN barrier layer. In a manner similar to that described with respect to the first compound semiconductor device 102, a 2-dimensional electron gas (2DEG) layer can be formed at the interface of the first additional compound semiconductor layer 132 and the second additional compound semiconductor layer 134 that enables the flow of electrons through the 2DEG and the first additional compound semiconductor layer 132 and the second additional compound semiconductor layer 134 can comprise at least a portion of a semiconductor layer that can be used to form one or more semiconductor devices, such as transistors. In one or more illustrative examples, the 2DEG layer can be formed at an interface of a first additional compound semiconductor layer 132 that is comprised of GaN and a second additional compound semiconductor layer 134 comprised of AlGaN.

Although not shown in the illustrative example of FIG. 1, the second compound semiconductor device 104 can include a nucleation layer that is disposed between the second substrate 130 and the first additional compound semiconductor layer 132. The nucleation layer can have a thickness from about nanometers to about 200 nanometers, from about 20 nanometers to about 100 nanometers, or from about 20 nanometers to about 80 nanometers. In addition, the nucleation layer can include an AlN-containing material. The nucleation layer can be used to form the first additional compound semiconductor layer 132.

A second dielectric layer 136 can be disposed on at least a portion of the second additional compound semiconductor layer 134. The second dielectric layer 136 can include a SiN-containing material. Additionally, a second gate electrical contact 138 can be disposed over a second gate region 140. The second gate electrical contact 138 can include one or more suitable metallic materials. For example, the second gate electrical contact 138 can include a gold-containing material. In one or more illustrative examples, the second gate electrical contact 138 can also include a nickel (Ni)/gold (Au) material. In one or more additional examples, the second gate electrical contact 138 can include a titanium-containing material.

Further, a second source electrical contact 142 can be disposed over a second source region 144 and a second drain electrical contact 146 can be disposed over a second drain region 148. The second source electrical contact 142 and the second drain electrical contact 146 can include one or more suitable metallic materials. To illustrate, the second source electrical contact 142 and the second drain electrical contact 146 can include a gold-containing material. In one or more additional illustrative examples, the second source electrical contact 142 and the second drain electrical contact 146 can include a Ti/Au metallic material.

A first bonding material layer 150 can couple the first source electrical contact 122 with the second source electrical contact 142. In addition, a second bonding material layer 152 can couple the first drain electrical contact 126 with the second drain electrical contact 146. The first bonding material layer 150 and the second bonding material layer 152 can include one or more conductive materials. For example, the first bonding material layer 150 and the second bonding material layer 152 can include at least one of copper, gold, or aluminum germanium.

The first compound semiconductor device 102 and the second compound semiconductor device 104 can be coupled such that a cavity 154 is formed. The cavity 154 can be filled with a gas. In one or more examples, the cavity 154 can be filled with an inert gas. To illustrate, the cavity 154 can be filled with at least one of nitrogen or argon. In various examples, a vacuum can be present to reduce pressure within the cavity 154. Additionally, the first compound semiconductor device 102 and the second compound semiconductor device 104 can be coupled such that a gap 156 is present between the first gate electrical contact 118 and the second gate electrical contact 138. In one or more illustrative examples, the gap 156 can be no greater than about 50 nanometers, no greater than about 40 nanometers, no greater than about 30 nanometers, no greater than about 20 nanometers, or no greater than about 10 nanometers. In one or more additional illustrative examples, the gap 156 can be from about 1 nanometer to about 50 nanometers, from about 5 nanometers to about 40 nanometers, from about 10 nanometers to about 30 nanometers, or from about 15 nanometers to about 35 nanometers.

In the illustrative example of FIG. 1, the first compound semiconductor device 102 can include a first thru via 158 and a second thru via 160. The first thru via 158 and the second thru via 160 can pass through the first substrate 106, the first compound semiconductor layer 112, and the second compound semiconductor layer 114. In one or more examples, the first thru via 158 and the second thru via 160 can be at least partially filled. For example, the first thru via 158 and the second thru via 160 can be at least partially filled with an Au-based metal. In the illustrative example of FIG. 1, the first thru via 158 is coupled to the first source electrical contact 122 and the second thru via 160 is coupled to the first drain electrical contact 126. Additionally, the first thru via 158 and the second thru via 160 can also be coupled to a metallic layer 162. In various examples, the metallic layer 162 can include a gold-containing material.

Additionally, although not shown in the illustrative example of FIG. 1, at least one of the first compound semiconductor device 102 or the second compound semiconductor device 104 can include one or more additional components. For example, at least one of the first compound semiconductor device 102 or the second compound semiconductor device 104 can include one or more capacitors, one or more inductors, one or more impedance devices, one or more additional electrical contacts, one or more connectors, one or more field plates, or one or more combinations thereof.

In one or more examples, at least one of the first compound semiconductor device 102 or the second compound semiconductor device 104 can include one or more interconnects. The one or more interconnects can include one or more metallic materials. The one or more interconnects can be formed within at least one of the first substrate 106 or the second substrate 130. The one or more interconnects can be formed using a damascene process. Additionally, one or more oxide materials can be disposed around the one or more interconnects. To illustrate, silicon dioxide ($SiO_2$) can be disposed around at least a portion of the one or more interconnects that are disposed within at least one of the first substrate 106 or the second substrate 130. In one or more illustrative examples, one or more first interconnects can be formed in the first substrate 106 and one or more second interconnects can be formed in the second substrate 130.

Figure 2:
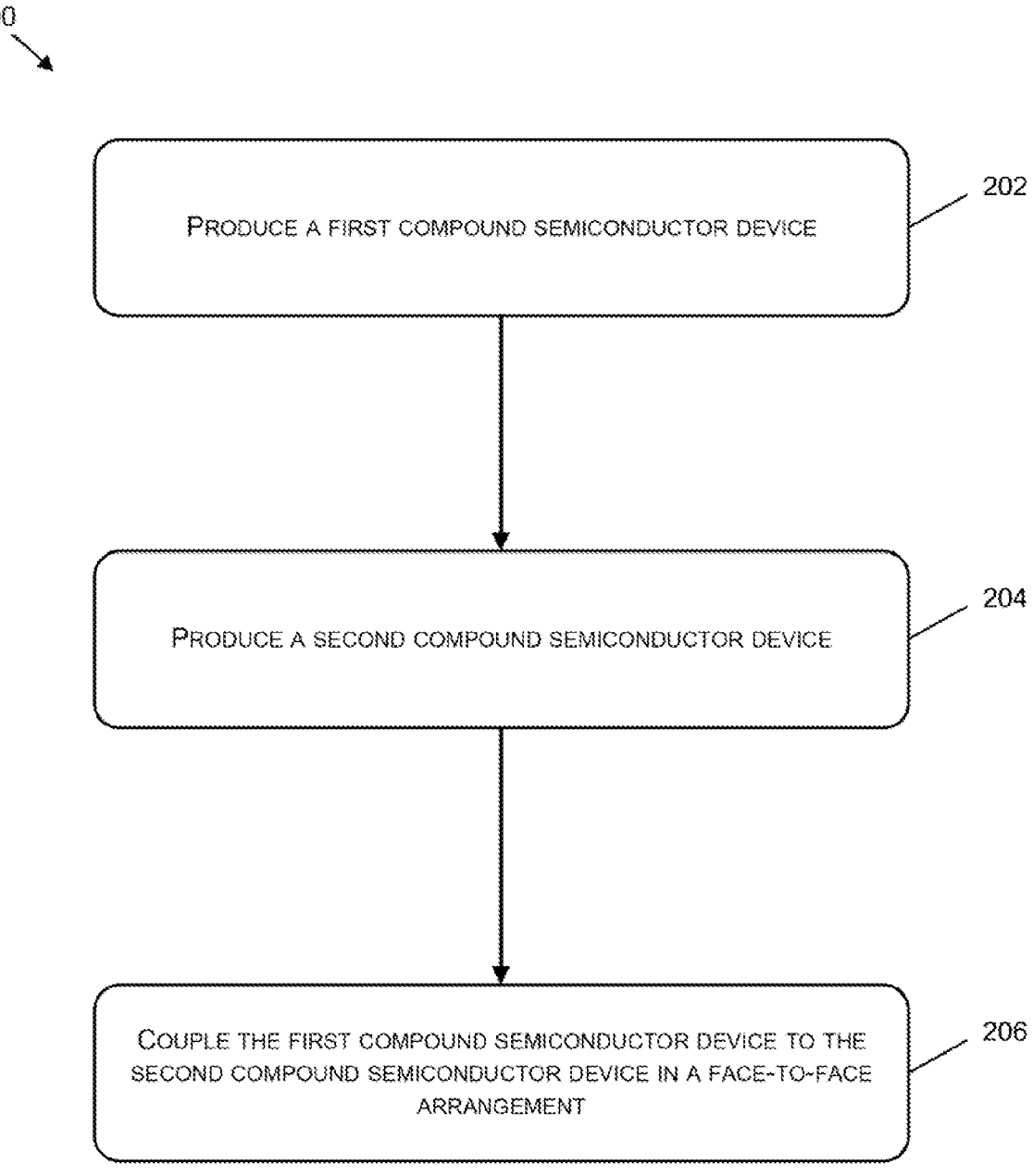
FIG. 2 is a flow diagram depicting operations of an example process to form a semiconductor device that includes a first compound semiconductor device coupled to a second compound semiconductor device in a face-to-face arrangement.

FIG. 2 is a flow diagram depicting operations of an example process 200 to form a semiconductor device that includes a first compound semiconductor device coupled to a second compound semiconductor device in a face-to-face arrangement. The process 200 can include, at 202, producing a first compound semiconductor device. The first compound semiconductor device can include a first substrate having an AlGaN/GaN semiconductor layer. For example, a GaN-based channel layer disposed on a surface of the first substrate. In addition, an AlGaN-based barrier layer can be disposed on at least a portion of the GaN-based channel layer. In illustrative examples, the first substrate can be trimmed from an initial thickness to a modified thickness. The initial thickness can be from about 250 micrometers to about 500 micrometers and the modified thickness can be from about 100 micrometers to about 200 micrometers, from about 50 micrometers to about 150 micrometers, or from about 150 micrometers to about 250 micrometers. Further, the first substrate can comprise a silicon-containing substrate, a silicon carbide-containing substrate, or a sapphire-containing substrate.

The first compound semiconductor device can also include one or more gate regions, one or more source regions, and one or more drain regions. In various examples, the first compound semiconductor device can include one or more transistors formed from the compound material semiconductor layer. In one or more illustrative examples, the first compound semiconductor device can include one or more transistors of a monolithic microwave integrated circuit. The one or more gate regions, one or more source regions, and one or more drain regions can be included in the AlGaN barrier layer. The electrical contacts can be formed by depositing one or more metal layers onto the portions of the AlGaN barrier layer that correspond to the one or more gate regions, the one or more source regions, and the one or more drain regions. The one or more metal layers can be deposited according to a pattern that corresponds with the locations of the one or more gate regions, the one or more drain regions, and the one or more source regions. The pattern can be formed using one or more mask layers. In addition, one or more photolithography processes and one or more etching processes can be used to produce one or more patterned metal layers that include electrical contacts for the one or more gate regions, the one or more drain regions, and the one or more source regions of the one or more transistors of the monolithic microwave integrated circuit. Electrical contacts for the one or more gate regions can be formed from and include one or more metals. For example, at least one of the one or more gate electrical contacts, the one or more source electrical contacts, or the one or more drain electrical contacts can be formed from and include a gold-containing metallic material.

In various examples, the first compound semiconductor device can also include a carrier substrate that is coupled to the first substrate. In addition, the first compound semiconductor device can include one or more thru vias. The one or more thru vias can provide electrical contact between at least one of one or more source electrical contacts or one or more drain electrical contacts and a conductive layer coupled to the first substrate. Additionally, one or more interconnects can also be formed to provide electrical connection between electrical features of the first compound semiconductor device and additional electrical features of an electronic device in which the first compound semiconductor device is located, such as additional electrical features of a monolithic microwave integrated circuit. In one or more illustrative examples, the one or more interconnects can be located within the first substrate.

At 204, the process 200 can include producing a second compound semiconductor device. The second compound semiconductor device can be similar to the first compound semiconductor device. For example, the second compound semiconductor device can include a second substrate having an AlGaN/GaN semiconductor layer with a GaN-based channel layer disposed on a surface of the second substrate and an AlGaN-based barrier layer disposed on at least a portion of the GaN-based channel layer. In one or more illustrative examples, the second substrate can be trimmed from an initial thickness of about 250 micrometers to about 500 micrometers to a modified thickness from about 100 micrometers to about 200 micrometers, from about 50 micrometers to about 150 micrometers, or from about 150 micrometers to about 250 micrometers. Further, the second substrate of the second compound semiconductor device can comprise a silicon-containing substrate, a silicon carbide-containing substrate, or a sapphire-containing substrate.

The second compound semiconductor device can also include one or more gate regions, one or more source regions, and one or more drain regions. In various examples, the second compound semiconductor device can include one or more transistors formed from the compound material semiconductor layer. In one or more illustrative examples, the second compound semiconductor device can include one or more transistors of a monolithic microwave integrated circuit. The one or more gate regions, one or more source regions, and one or more drain regions can be included in the AlGaN barrier layer. The electrical contacts can be formed by depositing one or more metal layers onto the portions of the AlGaN barrier layer that correspond to the one or more gate regions, the one or more source regions, and the one or more drain regions. The one or more metal layers can be deposited according to a pattern that corresponds with the locations of the one or more gate regions, the one or more drain regions, and the one or more source regions. The pattern can be formed using one or more mask layers.

In various examples, the pattern formed with respect to the second compound semiconductor device can be different from the pattern formed with respect to the first compound semiconductor device. In these scenarios, a layout of at least one of gate electrical contacts, source electrical contacts, or drain electrical contacts of the first compound semiconductor device can be different from a layout of at least one of gate electrical contacts, source electrical contacts, or drain electrical contacts of the second compound semiconductor device. In addition, one or more photolithography processes and one or more etching processes can be used to produce one or more patterned metal layers that includes electrical contacts for the one or more gate regions, the one or more drain regions, and the one or more source regions of the one or more transistors of the monolithic microwave integrated circuit. Electrical contacts for the one or more gate regions can be formed from and include one or more metals. For example, at least one of the one or more gate electrical contacts, the one or more source electrical contacts, or the one or more drain electrical contacts can be formed from and include a gold-containing metallic material. In various examples, the second compound semiconductor device can also include a carrier substrate that is coupled to the second substrate.

The process 200 can include, at operation 206, coupling the first compound semiconductor device to the second compound semiconductor device in a face-to-face arrangement. In one or more examples, the first compound semiconductor device can be coupled to the second compound semiconductor device using a bonding material. For example, the bonding material can be applied to at least a portion of the one or more drain electrical contacts of the first compound semiconductor device, at least a portion of the one or more source electrical contacts of the first compound semiconductor device, at least a portion of the one or more drain electrical contacts of the second compound semiconductor device, at least a portion of the one or more source electrical contacts of the second compound semiconductor device, or one or more combinations thereof. In various examples, the bonding material may be absent from the one or more gate electrical contacts of the first compound semiconductor device and the one or more gate electrical contacts of the second compound semiconductor device. In one or more illustrative examples, the bonding material can include aluminum germanium, copper, or gold.

In one or more examples, the bonding material can be heated after being applied to components of at least one of the first compound semiconductor device or the second compound semiconductor device. To illustrate, the bonding material can be heated to a temperature from about 350° C. to about 500° C. from about 350° C. to about 450° C. from about 400° C. to about 500° C., or from about 400° C. to about 450° C. In one or more illustrative examples, the bonding material can be heated to a temperature that is above a melting temperature of the bonding material. The first compound semiconductor device can then be joined to the second compound semiconductor device using the heated bonding material. In various examples, the first compound semiconductor device can be coupled to the second compound semiconductor device using a screen print bonding process.

In one or more additional examples, a first bonding process can be performed to couple the first compound semiconductor device to the second compound semiconductor device at relatively low temperatures followed by a second bonding process at higher temperatures. For example, a first bonding process can include bonding the first compound semiconductor device to the second compound semiconductor device using one or more gases to activate the surfaces of at least a portion of the first compound semiconductor device and at least a portion of the second compound semiconductor device. The one or more gases can include at least one of oxygen ($O_2$) or nitrogen ($N_2$). The first bonding process can be performed at temperatures from about 15° C. to about 125° C., from about 20° C. to about 100° C., from about 25° C. to about 80° C. or from about 20° C. to about 50° C. The first bonding process can also be performed at pressures from about 0.8 atm to about 1.2 atm. In one or more illustrative examples, the first bonding process can include one or more plasma activation processes.

After initially coupling the first compound semiconductor device and the second compound semiconductor device using the first bonding process, the second bonding process can be performed. The second bonding process can include heating bonding material disposed on at least a portion of the surfaces of at least one of the first compound semiconductor device or the second compound semiconductor device. The bonding material can include aluminum germanium, copper, or gold. Additionally, the bonding material can be heated to temperatures greater than a melting point of the bonding material. To illustrate, the bonding material can be heated to temperatures from about 350° C. to about 500° C., from about 350° C. to about 450° C., from about 400° C. to about 500° C., or from about 400° C. to about 450° C. The second bonding process can strengthen a coupling between the first compound semiconductor device and the second compound semiconductor device. Additionally, by performing a first bonding process at temperatures no greater than about 120° C. following by a second bonding process at temperatures of at least about 350° C., an amount of misalignment can be minimized between the first compound semiconductor device and the second compound semiconductor device that can be caused by thermal expansion of materials of the first compound semiconductor device and the second compound semiconductor device.

Bonding the first compound semiconductor device to the second compound semiconductor device can produce one or more cavities. For example, the coupling of the first compound semiconductor device and the second compound semiconductor device can produce a number of hermetically sealed cavities with each cavity including at least one gate electrical contact of the first compound semiconductor device and at least one gate electrical contact of the second compound semiconductor device. In various examples, an individual cavity can be filled with a gas. The gas can include an inert gas, such as nitrogen or argon.

Figure 3:
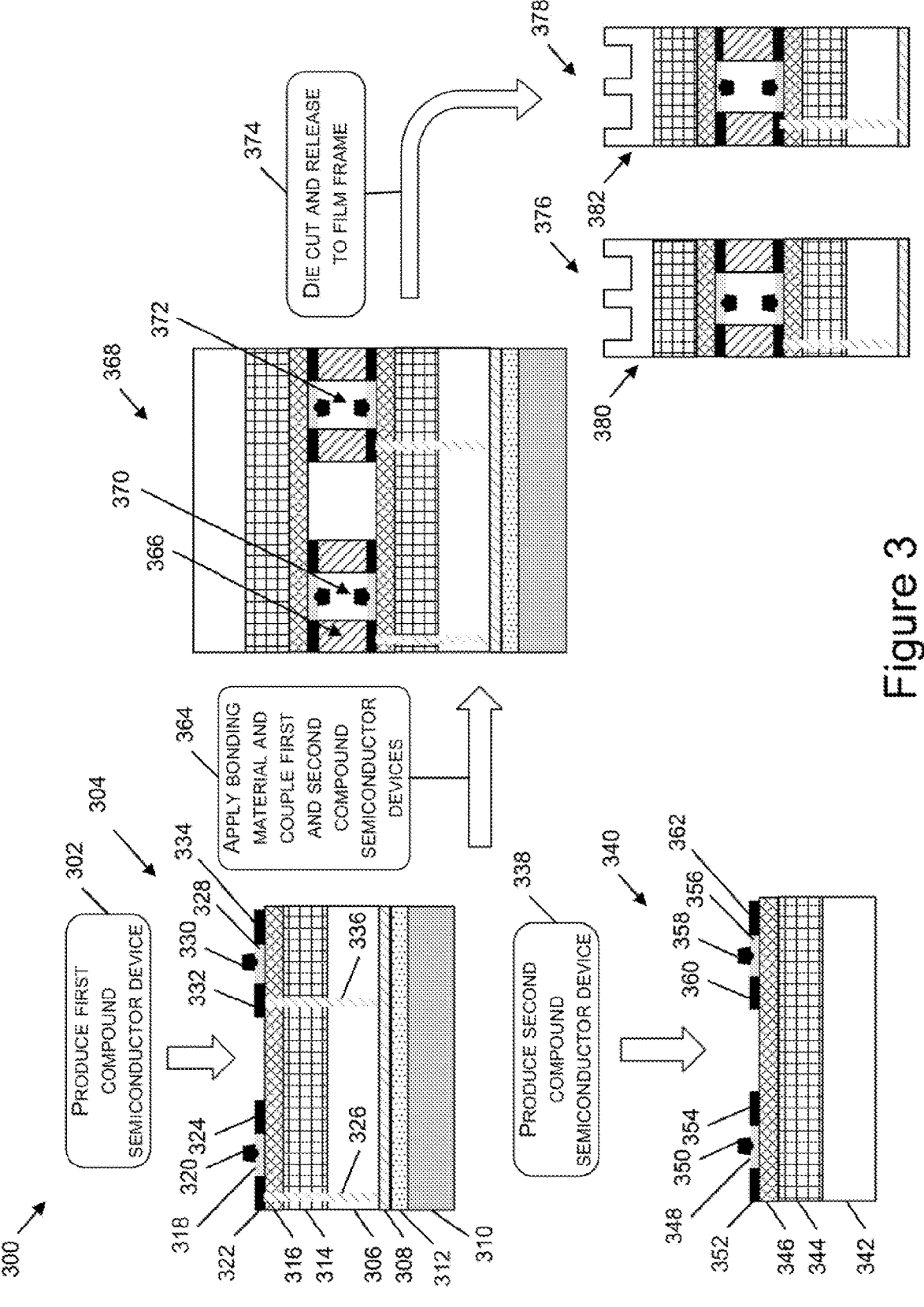
FIG. 3 is a diagram depicting an example process to produce a semiconductor device that includes a first compound semiconductor device coupled to a second compound semiconductor device in a face-to-face arrangement.

FIG. 3 is a diagram depicting an example process 300 to produce a semiconductor device that includes a first compound semiconductor device coupled to a second compound semiconductor device in a face-to-face arrangement. The process 300 can include, at 302, producing a first compound semiconductor device 304. The first compound semiconductor device 304 can include a first substrate 306. The first substrate 306 can be coupled to a first metallic layer 308. In addition, the first substrate 306 can be coupled to a carrier substrate 310 using a polymeric bonding material 312. In one or more illustrative examples, the first substrate 306 can include a SiC-containing substrate.

In addition, the first compound semiconductor device 304 can include a semiconductor layer that includes a first compound semiconductor layer 314 and a second compound semiconductor layer 316. In various examples, at least a first dielectric layer 318 can be disposed on the second compound semiconductor layer 316. The first compound semiconductor layer 314 can include a channel layer and the second compound semiconductor layer 316 can include a barrier layer. In one or more examples, the first compound semiconductor layer 314 can include a GaN channel layer and the second compound semiconductor layer 316 can include an AlGaN barrier layer.

A number of first electrical contacts can be formed on the second compound semiconductor layer 316, such as a first gate electrical contact 320, a first source electrical contact 322, and a first drain electrical contact 324. Further, a first thru via 326 can couple the first source electrical contact 322 to the metallic layer 308. A second dielectric layer 328 can be disposed on the second compound semiconductor layer 316. Additional electrical contacts can be formed on the second compound semiconductor layer 316, such as a first additional gate electrical contact 330, a first additional source electrical contact 332, and a first additional drain electrical contact 334. A first additional thru via 336 can couple the first additional source electrical contact 332 to the metallic layer 308. In one or more examples, the first electrical contacts 320, 322, 324 can be used to produce a first transistor, such as a first HEMT, and the first additional electrical contacts 330, 332, 332 can be used to produce a second transistor, such as a second HEMT.

At 338, the process 300 can include producing a second compound semiconductor device 340. The second compound semiconductor device 340 can include a second substrate 342. In one or more illustrative examples, the second substrate 342 can include a SiC-containing substrate. The second compound semiconductor device 340 can also include a semiconductor layer that includes a first additional compound semiconductor layer 344 and a second additional compound semiconductor layer 346. In various examples, at least a second dielectric layer 348 can be disposed on the second additional compound semiconductor layer 346. The first additional compound semiconductor layer 344 can include a channel layer and the second additional compound semiconductor layer 346 can include a barrier layer. In one or more examples, the first additional compound semiconductor layer 344 can include a GaN channel layer and the second additional compound semiconductor layer 346 can include an AlGaN barrier layer.

A number of second electrical contacts can be formed on the second additional compound semiconductor layer 346, such as a second gate electrical contact 350, a second source electrical contact 352, and a second drain electrical contact 354. Additional electrical contacts can be formed on the second additional compound semiconductor layer 346, such as a second additional gate electrical contact 358, a second additional source electrical contact 360, and a second additional drain electrical contact 362. In one or more examples, the second electrical contacts 350, 352, 354 can be used to produce a first additional transistor, such as a first additional HEMT, and the second additional electrical contacts 358, 360, 362 can be used to produce a second transistor, such as a second HEMT.

At 364, a layer of bonding material 366 can be applied to at least one of the electrical contacts 322, 324, 352, 354 and to at least one of the electrical contacts 332, 334, 360, 362 to couple the first compound semiconductor device 304 to the second compound semiconductor device 340. The layer of bonding material 366 can include one or more metals. In various examples, the first compound semiconductor device 304 can be coupled to the second compound semiconductor device 340 by heating the layer of bonding material 366. In one or more examples, one or more additional bonding operations can take place before heating the layer of bonding material 366. For example, surfaces of at least one of the first compound semiconductor device 304 or the second compound semiconductor device 340 can be activated using a plasma activation process performed at temperatures no greater than about 120° C. to produce an initial coupling between the first compound semiconductor device 304 and the second compound semiconductor device 340.

Coupling the first compound semiconductor device 304 to the second compound semiconductor device 340 can produce a compound semiconductor device 368. The compound semiconductor device 368 can include a first cavity 370 and a second cavity 372. The first cavity 370 can include the gate electrical contacts 320 and 350 while the second cavity 372 can include the gate electrical contacts 330 and 358. The gate electrical contacts 320 and 350 may not be coupled to each other such that there is a gap between the electrical contacts 320 and 350 within the first cavity 370. In addition, the gate electrical contacts 330 and 358 may not be coupled to each other such that there is a gap between the electrical contacts 330 and 358 within the second cavity 372. In various examples, the first cavity 370 and the second cavity 372 can be filled with a gas. In one or more examples, the gas can include nitrogen or argon. Additionally, a vacuum can be present in at least one of the first cavity 370 or the second cavity 372. Further, at least one of the first cavity 370 and the second cavity 372 can be hermetically sealed. In one or more additional examples, one or more alignment structures can be formed on at least one of the first compound semiconductor device 304 or the second compound semiconductor device 340 to minimize an amount of misalignment between the first compound semiconductor device 304 and the second compound semiconductor device 340. The one or more alignment structures can be produced by depositing one or more layers of material that is used to form the one or more alignment structures. The one or more alignment structures can be formed from one or more dielectric materials or one or more metallic materials. In addition, the one or more alignment structures can be produced by depositing one or more first layers of photoresist on at least one layer of material used to form the one or more alignment structures on the first compound semiconductor device 304 and depositing one or more second layers of photoresist on at least one layer of material used to form the one or more alignment structures on the second compound semiconductor device 340. Patterns can be etched into the one or more first layers of photoresist and the one or more second layers of photoresist that correspond to the one or more alignment features.

As the first compound semiconductor device 304 is coupled to the second compound semiconductor device 340, the one or more alignment features of the first compound semiconductor device 304 and the second compound semiconductor device 340 can arranged such that the first gate electrical contact 320 is aligned with the second gate electrical contact 350 and the first additional gate electrical contact 330 is aligned with the second additional gate electrical contact 358.

At 374, the process 300 can include a die cutting operation and releasing the compound semiconductor device 368 to a film frame. Releasing the compound semiconductor device 368 to a film frame can include decoupling the carrier substrate 310 and coupling the compound semiconductor device 368 to a film frame. The film frame is not shown in FIG. 3. Additionally, the die cutting operation may be used to produce a first semiconductor device 376 and a second semiconductor device 378. Each semiconductor device 376, 378 can include electrical components of one or more transistors. Further, a first modified second substrate 380 and a second modified second substrate 382 can be formed by forming recessed regions within the portion of the second substrate 342 associated with the first semiconductor device 376 and recessed regions within the portion of the second substrate 342 associated with the second semiconductor device 378. The recessed regions formed in the second substrate 342 can be shaped like fins that can increase dissipation of heat produced during operation of the first semiconductor device 376 and the second semiconductor device 378. In one or more illustrative examples, at least one of the first semiconductor device 376 or the second semiconductor device 378 can operate as a high electron mobility transistor. In one or more additional examples, at least one of the first semiconductor device 376 or the second semiconductor device 378 can be included in a monolithic microwave integrated circuit.

In at least some implementations, having the gate electrical contacts 320 and 330 disposed in a face-to-face arrangement with gate electrical contacts 348 and 358 can minimize effects of electrical fields produced during operation of the first semiconductor device 376 and the second semiconductor device 378. Further, at least one of the first semiconductor device 376 or the second semiconductor device 378 can have a power density of at least 5 watts (W) per millimeter (mm) of gate width, at least 6 W per mm of gate width, at least 7 W per mm of gate width, at least 8 W per mm of gate width, at least 9 W per mm of gate width, or at least 10 W per mm of gate width. In one or more illustrative examples, at least one of the first semiconductor device 376 or the second semiconductor device 378 can have a power density from about 5 W per mm of gate width to about 2 W per mm of gate width, from about 6 W per mm of gate width to about 18 W per mm of gate width, from about 7 W per mm of gate width to about 15 W per mm of gate width, from about 8 W per mm of gate width to about 12 W per mm of gate width, from about 6 W per mm of gate width to about 12 W per mm of gate width, or from about 5 W per mm of gate width to about 10 W per mm of gate width.

A numbered non-limiting list of aspects of the present subject matter is presented below.

Aspect 1. A semiconductor device comprising: a first compound semiconductor device including: a first semiconductor layer that includes a first barrier layer and a first channel layer, the first channel layer being comprised of a compound material having a Group 13 element and a Group 15 element; and a first drain electrical contact, a first source electrical contact, and a first gate electrical contact disposed on the first channel layer; and a second compound semiconductor device including: a second semiconductor layer that includes a second barrier layer and a second channel layer, the second channel layer being comprised of the compound material having the Group 13 element and the Group 15 element: a second drain electrical contact, a second source electrical contact, and a second gate electrical contact disposed on the second channel layer; and wherein the first compound semiconductor device and the second compound semiconductor device are coupled in a face-to-face arrangement that forms a cavity in which the first gate electrical contact and the second gate electrical contact are disposed.

Aspect 2. The semiconductor device of aspect 1, wherein: a gap is present between the first gate electrical contact and the second gate electrical contact; and the gap is from about 5 nanometers to about 40 nanometers.

Aspect 3. The semiconductor device of aspect 1 or 2, wherein: the first source electrical contact is coupled to the second source electrical contact by an amount of bonding material disposed between the first source electrical contact and the second source electrical contact; and the first drain electrical contact is coupled to the second drain electrical contact by an additional amount of the bonding material disposed between the first drain electrical contact and the second drain electrical contact.

Aspect 4. The semiconductor device of aspect 3, wherein: the bonding material includes at least one of aluminum germanium, copper, or gold; and a gas is present in the cavity that includes nitrogen or argon.

Aspect 5. The semiconductor device of any one of aspects 1-4, wherein: the first compound semiconductor device includes a substrate coupled to the first barrier layer; a metallic layer coupled to the substrate; one or more thru vias disposed in the first semiconductor layer and the substrate; and the one or more thru vias electrically connect the metallic layer to at least one of the first source electrical contact or the second source electrical contact.

Aspect 6. The semiconductor device of aspect 5, wherein: the substrate includes silicon carbide (SiC); and one or more interconnects are formed within the substrate.

Aspect 7. The semiconductor device of any one of aspects 1-6, wherein: the second compound semiconductor device includes an additional substrate coupled to the second barrier layer; and one or more recessed regions are formed from the additional substrate, wherein the one or more recessed regions form one or more fins to dissipate heat produced during use of the compound semiconductor device.

Aspect 8. The semiconductor device of any one of aspects 1-7, wherein the compound semiconductor device has a power density of at least about 8 Watts per millimeter gate width to about 12 Watts per mm gate width at frequencies from about 25 GHz to about 35 GHz.

Aspect 9. A process to produce a compound semiconductor device, the process comprising: producing a first compound semiconductor device, the first compound semiconductor device including: a first semiconductor layer that includes a first barrier layer and a first channel layer, the first channel layer being comprised of a compound material having a Group 13 element and a Group 15 element; and a first drain electrical contact, a first source electrical contact, and a first gate electrical contact disposed on the first channel layer; producing a second compound semiconductor device, the second compound semiconductor device including: a second semiconductor layer that includes a second barrier layer and a second channel layer, the second channel layer being comprised of the compound material having the Group 13 element and the Group 15 element; a second drain electrical contact, a second source electrical contact, and a second gate electrical contact disposed on the second channel layer; and coupling the first compound semiconductor device to the second compound semiconductor device in a face-to-face arrangement to produce the compound semiconductor device.

Aspect 10. The process of aspect 9, comprising: applying a bonding material to at least a portion of at least one of the first compound semiconductor device or the second compound semiconductor device to couple the first compound semiconductor device to the second compound semiconductor device.

Aspect 11. The process of aspect 10, wherein the bonding material includes at least one of aluminum germanium, copper, or gold.

Aspect 12. The process of aspect 10 or 11, comprising: heating the bonding material to a temperature from about 375° C. to about 450° C. to produce a heated bonding material; and wherein the first compound semiconductor device is coupled to the second compound semiconductor device using the heated bonding material.

Aspect 13. The process of any one of aspects 10-12, wherein the bonding material is applied to at least one of the first drain electrical contact or the second drain electrical contact and the bonding material is applied to at least one of the first source electrical contact or the first drain electrical contact.

Aspect 14. The process of any one of aspects 10-13, comprising: performing one or more operations to activate one or more surfaces of at least one of the first compound semiconductor device or the second compound semiconductor device to couple the first compound semiconductor device to the second compound semiconductor device.

Aspect 15. The process of aspect 14, wherein the one or more surfaces are activated using a plasma activation process performed at temperatures no greater than 120° C. and using an oxygen-containing gas.

Aspect 16. The process of aspect 15, comprising: heating the bonding material after performing the one or more operations to activate the one or more surfaces.

Aspect 17. The process of any one of aspects 9-16, wherein the first compound semiconductor device includes a substrate that is coupled to the first semiconductor layer and the first substrate is coupled to a carrier substrate by an additional bonding material, the additional bonding material including a polymeric bonding material.

Aspect 18. The process of aspect 17, comprising: removing the carrier substrate; cutting the semiconductor die to produce a plurality of compound semiconductor devices, individual compound semiconductor devices including: at least one first drain electrical contact of the first compound semiconductor device coupled to at least one second drain electrical contact of the second compound semiconductor device by an amount of bonding material; at least one first source electrical contact of the first compound semiconductor device coupled to at least one second source electrical contact of the second compound semiconductor device by an additional amount of the bonding material; and a cavity including at least one first gate electrical contact of the first compound semiconductor device and at least one second gate electrical contact of the second compound semiconductor device.

Aspect 19. The process of any one of aspects 9-18, wherein: the compound semiconductor device includes a cavity that includes the first gate electrical contact and the second gate electrical contact disposed in a face-to-face-arrangement; and a gap is present between the first gate electrical contact and the second gate electrical contact.

Aspect 20. The process of aspect 19, wherein the cavity is filled with an inert gas.

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These implementations are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other implementations can be used, such as by one of ordinary skill in the art upon reviewing the above description. The Abstract is provided to comply with 37 C.F.R. § 1.72 (b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed implementation. Thus, the following claims are hereby incorporated into the Detailed Description as examples or implementations, with each claim standing on its own as a separate implementation, and it is contemplated that such implementations can be combined with each other in various combinations or permutations. The scope of the invention should be determined with reference to the appended claims, along with the full scope of equivalents to which such claims are entitled.

What is claimed is:

1. A semiconductor device comprising:
a first compound semiconductor device including:
   a first semiconductor layer that includes a first barrier layer and a first channel layer, the first channel layer being comprised of a compound material having a Group 13 element and a Group 15 element; and
   a first drain electrical contact, a first source electrical contact, and a first gate electrical contact disposed on the first channel layer; and
a second compound semiconductor device including:
   a second semiconductor layer that includes a second barrier layer and a second channel layer, the second channel layer being comprised of the compound material having the Group 13 element and the Group 15 element; and
   a second drain electrical contact, a second source electrical contact, and a second gate electrical contact disposed on the second channel layer; and
wherein the first compound semiconductor device and the second compound semiconductor device are coupled in a face-to-face arrangement such that a gap is present between the first gate electrical contact and the second gate electrical contact.

2. The semiconductor device of claim 1, wherein:
the gap is from about 5 nanometers to about 40 nanometers.

3. The semiconductor device of claim 1, wherein:
the first source electrical contact is coupled to the second source electrical contact by an amount of bonding material disposed between the first source electrical contact and the second source electrical contact; and
the first drain electrical contact is coupled to the second drain electrical contact by an additional amount of the bonding material disposed between the first drain electrical contact and the second drain electrical contact.

4. The semiconductor device of claim 3, wherein:
the bonding material includes at least one of aluminum germanium, copper, or gold;
the first gate electrical contact and the second gate electrical contact are disposed in a cavity; and
a gas is present in the cavity that includes nitrogen or argon.

5. The semiconductor device of claim 1, wherein:
the first compound semiconductor device includes a substrate coupled to the first barrier layer;
a metallic layer coupled to the substrate;
one or more thru vias disposed in the first semiconductor layer and the substrate; and
the one or more thru vias electrically connect the metallic layer to at least one of the first source electrical contact or the second source electrical contact.

6. The semiconductor device of claim 5, wherein:
the substrate includes silicon carbide (SiC); and
one or more interconnects are formed within the substrate.

7. The semiconductor device of claim 1, wherein:
the second compound semiconductor device includes an additional substrate coupled to the second barrier layer; and
one or more recessed regions are formed from the additional substrate, wherein the one or more recessed regions form one or more fins to dissipate heat produced during use of the semiconductor device.

8. The semiconductor device of claim 1, wherein the compound semiconductor device has a power density of at least about 8 Watts per millimeter gate width to about 12 Watts per mm gate width at frequencies from about 25 GHz to about 35 GHz.

9. A process to produce a compound semiconductor device, the process comprising:

producing a first compound semiconductor device, the first compound semiconductor device including:

a first semiconductor layer that includes a first barrier layer and a first channel layer, the first channel layer being comprised of a compound material having a Group 13 element and a Group 15 element; and a first drain electrical contact, a first source electrical contact, and a first gate electrical contact disposed on the first channel layer;

producing a second compound semiconductor device, the second compound semiconductor device including:

a second semiconductor layer that includes a second barrier layer and a second channel layer, the second channel layer being comprised of the compound material having the Group 13 element and the Group 15 element; and a second drain electrical contact, a second source electrical contact, and a second gate electrical contact disposed on the second channel layer; and coupling the first compound semiconductor device to the second compound semiconductor device in a face-to-face arrangement to produce the compound semiconductor device such that a gap is present between the first gate electrical contact and the second gate electrical contact.

10. The process of claim 9, comprising:

applying a bonding material to at least a portion of at least one of the first compound semiconductor device or the second compound semiconductor device to couple the first compound semiconductor device to the second compound semiconductor device.

11. The process of claim 10, wherein the bonding material includes at least one of aluminum germanium, copper, or gold.

12. The process of claim 10, comprising:

heating the bonding material to a temperature from about 375° C. to about 450° C. to produce a heated bonding material; and wherein the first compound semiconductor device is coupled to the second compound semiconductor device using the heated bonding material.

13. The process of claim 10, wherein the bonding material is applied to at least one of the first drain electrical contact or the second drain electrical contact and the bonding material is applied to at least one of the first source electrical contact or the first drain electrical contact.

14. The process of claim 10, comprising:

performing one or more operations to activate one or more surfaces of at least one of the first compound semiconductor device or the second compound semiconductor device to couple the first compound semiconductor device to the second compound semiconductor device.

15. The process of claim 14, wherein the one or more surfaces are activated using a plasma activation process performed at temperatures no greater than 120° C. and using an oxygen-containing gas.

16. The process of claim 15, comprising:

heating the bonding material after performing the one or more operations to activate the one or more surfaces.

17. The process of claim 9, wherein the first compound semiconductor device includes a substrate that is coupled to the first semiconductor layer and the first-substrate is coupled to a carrier substrate by an additional bonding material, the additional bonding material including a polymeric bonding material.

18. The process of claim 17, comprising:

removing the carrier substrate;

performing a die cutting operation to produce a plurality of compound semiconductor devices, individual compound semiconductor devices including:

at least one first drain electrical contact of the first compound semiconductor device coupled to at least one second drain electrical contact of the second compound semiconductor device by an amount of bonding material;

at least one first source electrical contact of the first compound semiconductor device coupled to at least one second source electrical contact of the second compound semiconductor device by an additional amount of the bonding material; and a cavity including at least one first gate electrical contact of the first compound semiconductor device and at least one second gate electrical contact of the second compound semiconductor device.

19. The process of claim 9, wherein:

the compound semiconductor device includes a cavity that includes the first gate electrical contact and the second gate electrical contact disposed in a face-to-face-arrangement.

20. The process of claim 19, wherein the cavity is filled with an inert gas.

* * * * *